United States Patent
Owechko (10) Patent No.: US 9,575,162 B2
(45) Date of Patent: Feb. 21, 2017

(54) COMPRESSIVE SCANNING LIDAR

(71) Applicant: HRL LABORATORIES LLC, Malibu, CA (US)

(72) Inventor: Yuri Owechko, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 406 days.

(21) Appl. No.: 14/317,753

(22) Filed: Jun. 27, 2014

(65) Prior Publication Data

US 2015/0378011 A1    Dec. 31, 2015

(51) Int. Cl.
*G01S 7/481* (2006.01)
*G01S 17/02* (2006.01)
(Continued)

(52) U.S. Cl.
CPC ............ *G01S 7/4817* (2013.01); *G01S 7/4808* (2013.01); *G01S 17/02* (2013.01); *G01S 17/325* (2013.01);
(Continued)

(58) Field of Classification Search
CPC ........ G01N 21/47; G01N 21/49; G01N 21/55; G01N 2021/1793; G01N 2201/0675
(Continued)

(56) References Cited

U.S. PATENT DOCUMENTS 4,615,619 A * 10/1986 Fateley ................. G02F 1/0147
356/310
2002/0171901 A1   11/2002 Bernstein
(Continued)

OTHER PUBLICATIONS

From U.S. Appl. No. 14/317,695 (Not yet published), Notice of Allowance mailed on Dec. 11, 2015.
(Continued)

*Primary Examiner* — Luke Ratcliffe
(74) *Attorney, Agent, or Firm* — Ladas & Parry (57) ABSTRACT

A method for increasing resolution of an image formed of received light from an illuminated spot includes measuring a y vector for measurement kernels $A_1$ to $A_M$, where M is a number of the measurement kernels, measuring the y vector including programming a programmable N-pixel micromirror or mask located in a return path of a received reflected scene spot with a jth measurement kernel $A_j$ of the measurement kernels $A_1$ to $A_M$, measuring y, wherein y is an inner product of a scene reflectivity $f(\alpha,\beta)$ with the measurement kernel $A_j$ for each range bin $r_i$, wherein $\alpha$ and $\beta$ are azimuth and elevation angles, respectively, repeating programming the programmable N-pixel micromirror or mask and measuring y for each measurement kernel $A_1$ to $A_M$, and forming a reconstructed image using the measured y vector, wherein forming the reconstructed image includes using compressive sensing or Moore-Penrose reconstruction.

20 Claims, 6 Drawing Sheets

(51) Int. Cl.
 *H01S 5/02* (2006.01)
 *H01S 5/026* (2006.01)
 *H01S 5/12* (2006.01)
 *G01S 17/32* (2006.01)
 *G01S 17/89* (2006.01)
 *G01S 7/48* (2006.01)

(52) U.S. Cl.
 CPC .............. *G01S 17/89* (2013.01); *H01S 5/021* (2013.01); *H01S 5/0215* (2013.01); *H01S 5/0262* (2013.01); *H01S 5/12* (2013.01)

(58) Field of Classification Search
 USPC ........................................................ 356/4.01
 See application file for complete search history.

(56) References Cited

U.S. PATENT DOCUMENTS

| | | |
|---|---|---|
| 2005/0286832 A1 | 12/2005 | Witzens et al. |
| 2006/0227317 A1 | 10/2006 | Henderson et al. |
| 2007/0036509 A1 | 2/2007 | Kakui et al. |
| 2009/0154872 A1 | 6/2009 | Sherrer et al. |
| 2009/0310459 A1 | 12/2009 | Gage et al. |
| 2010/0271614 A1 | 10/2010 | Albuquerque et al. |
| 2011/0019154 A1 | 1/2011 | Jennings et al. |
| 2011/0164783 A1* | 7/2011 | Hays ....................... G01S 17/58 382/100 |
| 2011/0260036 A1 | 10/2011 | Baraniuk et al. |
| 2011/0286066 A1 | 11/2011 | Weiss et al. |
| 2012/0069342 A1* | 3/2012 | Dalgleish ............... G01N 21/47 356/445 |
| 2012/0120390 A1 | 5/2012 | Fattal et al. |
| 2012/0170029 A1 | 7/2012 | Azzazy et al. |
| 2012/0236379 A1 | 9/2012 | Da Silva et al. |
| 2013/0088726 A1 | 4/2013 | Goyal et al. |
| 2014/0204385 A1* | 7/2014 | Ouyang ................. G01N 21/47 356/445 |
| 2014/0313519 A1 | 10/2014 | Shpunt et al. |
| 2015/0015869 A1 | 1/2015 | Smith et al. |

OTHER PUBLICATIONS

From U.S. Appl. No. 14/317,695 (Unpublished, Non Publication Requested), Non-Final Rejection mailed on Sep. 9, 2015.
International Search Report and Written Opinion for PCT/US2014/044741 mailed Mar. 24, 2015.
International Search Report and Written Opinion for PCT/US2014/044745 mailed Mar. 26, 2015.
U.S. Appl. No. 14/317,695, Sayyah et al., filed Jun. 27, 2014.
Richard G. Baraniuk "Compressive Sensing", IEEE Signal Processing Magazine, pp. 118-124, (Jul. 2007).
From U.S. Appl. No. 14/317,695, Application and Office Actions.

* cited by examiner

COMPRESSIVE SCANNING LIDAR

CROSS REFERENCE TO RELATED APPLICATIONS

This application is related to U.S. patent application Ser. No. 14/317,695, filed on Jun. 27, 2014 which is incorporated herein by reference as though set forth in full.

STATEMENT REGARDING FEDERAL FUNDING

None

TECHNICAL FIELD

This disclosure relates to LIght Detection And Ranging (LIDAR or lidar), and in particular scanning lidars.

BACKGROUND

Existing real-time lidar systems consist of two general types. The first type consists of large and expensive mechanically scanned lidar systems such as the Velodyne-64, marketed by Velodyne Lidar, Inc. Such mechanically scanned lidar systems use large rotating mirrors to scan multiple laser beams and use time of flight detection of reflected laser pulses to measure the range of each spot along the beam directions. The second type consists of flash lidars that illuminate the entire scene with each pulse and use an array of time-gated photodiodes to image the reflected light and measure the range for each pixel.

Rotating mirror LIDAR systems are large, heavy, power-hungry, and have poor angular resolution in the elevation direction, which is limited by the number of laser beams, for example, 64 beams in the case of the Velodyne-64 lidar. The azimuth resolution is limited by the laser spot size. Flash lidar systems have limited range because the laser pulse power is spread out over the entire scene, which greatly reduces the amount of power reflected by an object and captured by the detector aperture. In addition, the flash lidar angular resolution and field of view are limited by the number of time-gated photodiodes in the detector array.

What is needed is a lidar with reduced size weight and power (SWAP) that has an improved field of view (FOV), range resolution, and angular resolution. Also needed is a lidar that enables imaging different parts of the 3D scene with variable resolution, thereby allowing high angular resolution 3D imaging of the most salient or important regions of interest while maintaining a high frame rate and keeping the computational load low. The embodiments of the present disclosure answer these and other needs.

SUMMARY

In a first embodiment disclosed herein, a method for increasing resolution of an image formed of received light from an illuminated spot comprises measuring a y vector for measurement kernels $A_1$ to $A_M$, where M is a number of the measurement kernels, measuring the y vector comprising: programming a programmable N-pixel micromirror or mask located in a return path of a received reflected scene spot with a jth measurement kernel $A_j$ of the measurement kernels $A_1$ to $A_M$; measuring y, wherein y is an inner product of a scene reflectivity $f(\alpha,\beta)$ with the measurement kernel $A_j$ for each range bin $r_i$, wherein $\alpha$ and $\beta$ are azimuth and elevation angles, respectively; repeating programming the programmable N-pixel micromirror or mask and measuring y for each measurement kernel $A_1$ to $A_M$; and forming a reconstructed image using the measured y vector, wherein forming the reconstructed image comprises using compressive sensing or Moore-Penrose reconstruction.

In another embodiment disclosed herein, a LIDAR system comprises: a pulsed frequency modulated laser having an emitted beam with power $\Phi_o$; a micromirror optically coupled to the laser for scanning the emitted beam across a scene to illuminate spots in the scene; a photodiode detector; a portion of the emitted beam with power $\Phi_{lo}$ coupled to the photodiode detector; and a programmable N-pixel mirror or mask array in an optical path of reflected received light from an illuminated spot, the programmable N-pixel mirror or mask array optically coupled to the photodiode detector.

In another embodiment disclosed herein, a LIDAR comprises a scanning laser for scanning a scene and illuminating a spot in the scene; a photodiode detector for detecting received light reflected from the scene; a programmable N-pixel mirror or mask array in an optical path of reflected received light, the programmable N-pixel mirror or mask array optically coupled to the photodiode detector; and means for forming a reconstructed image comprising compressive sensing or Moore-Penrose reconstruction.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure is for a compact and low cost real-time LIDAR sensing system that utilizes a scanned laser beam, programmable micromirror array, detection using a single photodiode, and reconstruction using compressive sensing methods to sense a 3D representation of a scene with large field of view and angular resolution that is not limited by the laser spot size. Multiple photodiodes may also be used by dividing the imaged spot into sections and using one photodiode per section in order to speed up processing using parallel computing.

This approach also allows imaging different parts of the 3D scene with variable angular resolution, thereby allowing high resolution imaging of the most salient or important regions of interest while maintaining a high frame rate and keeping the computational load low.

Compressive sensing has been described by Richard G. Baraniuk in "Compressive Sensing", IEEE Signal Processing Magazine pages 118-124 July 2007, which is incorporated herein as though set forth in full.

The SWAP and cost for a lidar in accordance with the present disclosure is much smaller than existing rotating mirror systems and the angular resolution and field of view is much greater than existing flash LIDAR systems based on imaging detector arrays. The resolution can also be adapted to different regions of interest in the scene, which greatly increases the optical and computational efficiency of the system.

The compressive sensing lidar of the present disclosure combines the light efficiency and large field of view of mechanically scanned mirror systems with high resolution reconstruction of the 3D scene in all three dimensions of azimuth, elevation, and range, all in a compact and low cost package based on micro-mirror array technology and compressive sensing reconstruction methods. By using frequency modulation continuous wave (FMCW) modulation and heterodyne detection using a single photodiode combined with compressive sensing reconstruction algorithms, a 3D scene can be sensed with an angular resolution that is not limited by the laser spot size or the number of detector elements.

Figure 1:
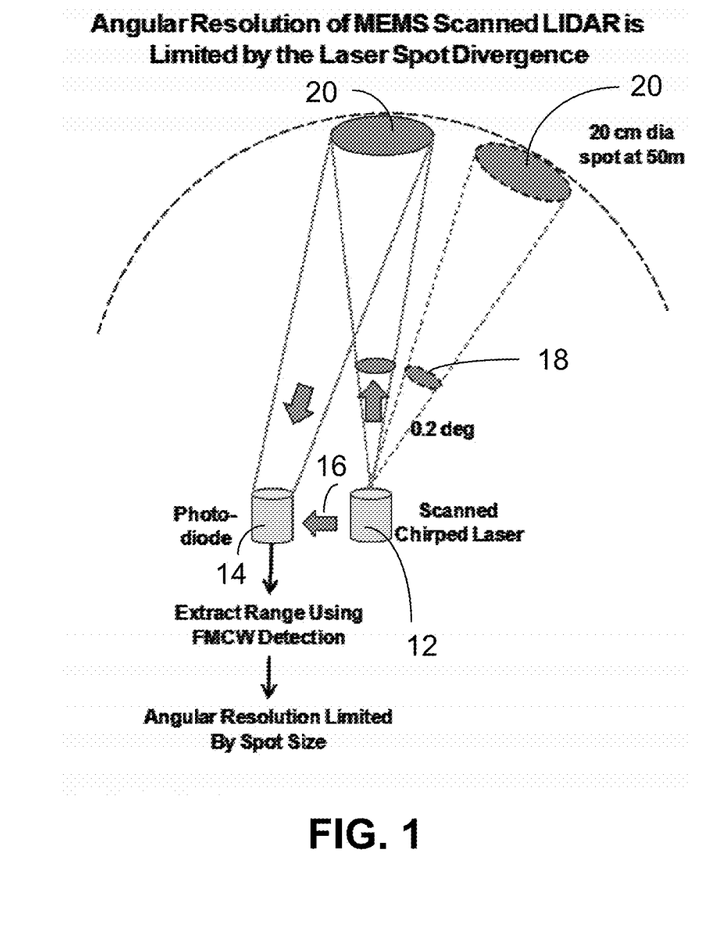
FIG. 1 shows a scanned LIDAR in accordance with (L&P 628659-9) in which the angular resolution is limited by the laser spot divergence.

The U.S. Patent Application filed on Jun. 27, 2014, having Ladas & Parry reference no. B-7981 628659-9, and entitled "SINGLE CHIP SCANNING LIDAR AND METHOD OF PRODUCING THE SAME," filed concurrently herewith, which is incorporated herein by reference, describes a micro-elecro-mechanical system (MEMS) micromirror scanned LIDAR system, which is a low cost and low SWAP alternative to prior art real-time LIDAR systems. The operation of the scanned lidar system is shown in FIG. 1. The system utilizes a scanned laser 12, frequency modulation continuous wave (FMCW) modulation of the laser, a single photodiode 14, and coherent detection 16 of the FMCW modulation to measure the range of targets individual 3D (three dimensional) resolution elements. Both the transmitted laser pulse and receiver aperture are scanned synchronously in azimuth and elevation using dual-axis micromirrors to maximize the signal to noise ratio (SNR). As shown in FIG. 1, the angular resolution of the MEMS scanned mirror system is limited by the laser spot divergence. For a typical laser divergence 18 of 0.2 degrees, this results in a 20 cm diameter spot 20 at a range of 50 m. While this is sufficient for detecting an object the size of a pedestrian, many applications such as object recognition require finer resolution at larger ranges.

Figure 2:
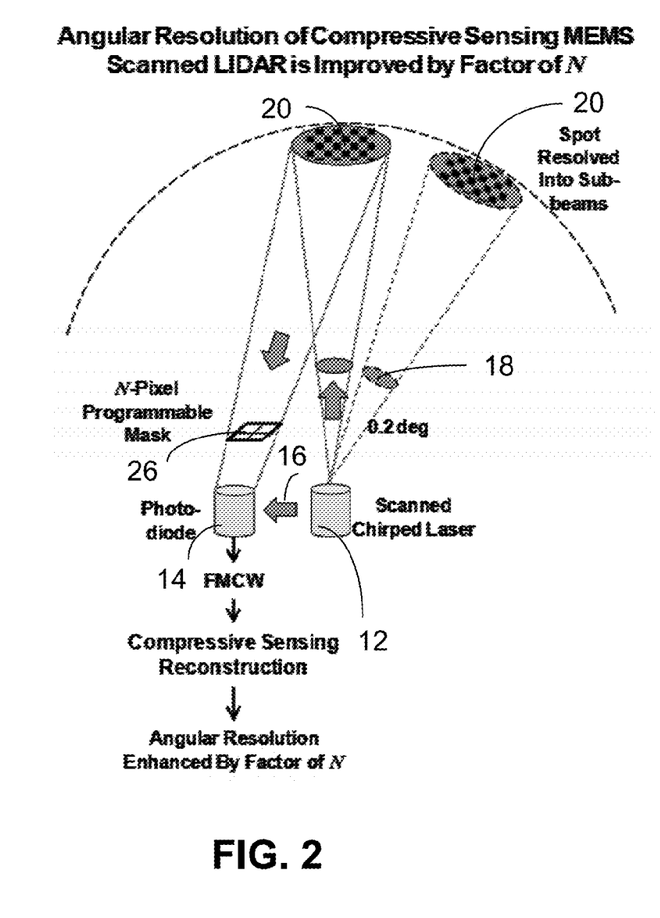
FIG. 2 shows a scanned LIDAR in which the angular resolution is improved by a factor of N using compressive sensing in accordance with the present disclosure.

FIG. 2 shows a scanning laser using compressive sensing in accordance with the present disclosure. A programmable AT-mirror MEMS mirror array or a programmable N-pixel mask 26 is used in the receiver aperture in order to perform compressive measurements using the same basic architecture as described in FIG. 1. The programmable N-mirror MEMS mirror array or a programmable N-pixel mask 26 may be implemented as a MEMS. By using nonlinear compressive sensing reconstruction methods the angular resolution may be increased by a factor of N in the number of resolvable azimuth and elevation angles. The programmable micromirror array 26 may be an N-pixel micromirror array, such as the Digital Micromirror Device (DMD) made by Texas Instruments.

Figure 3:
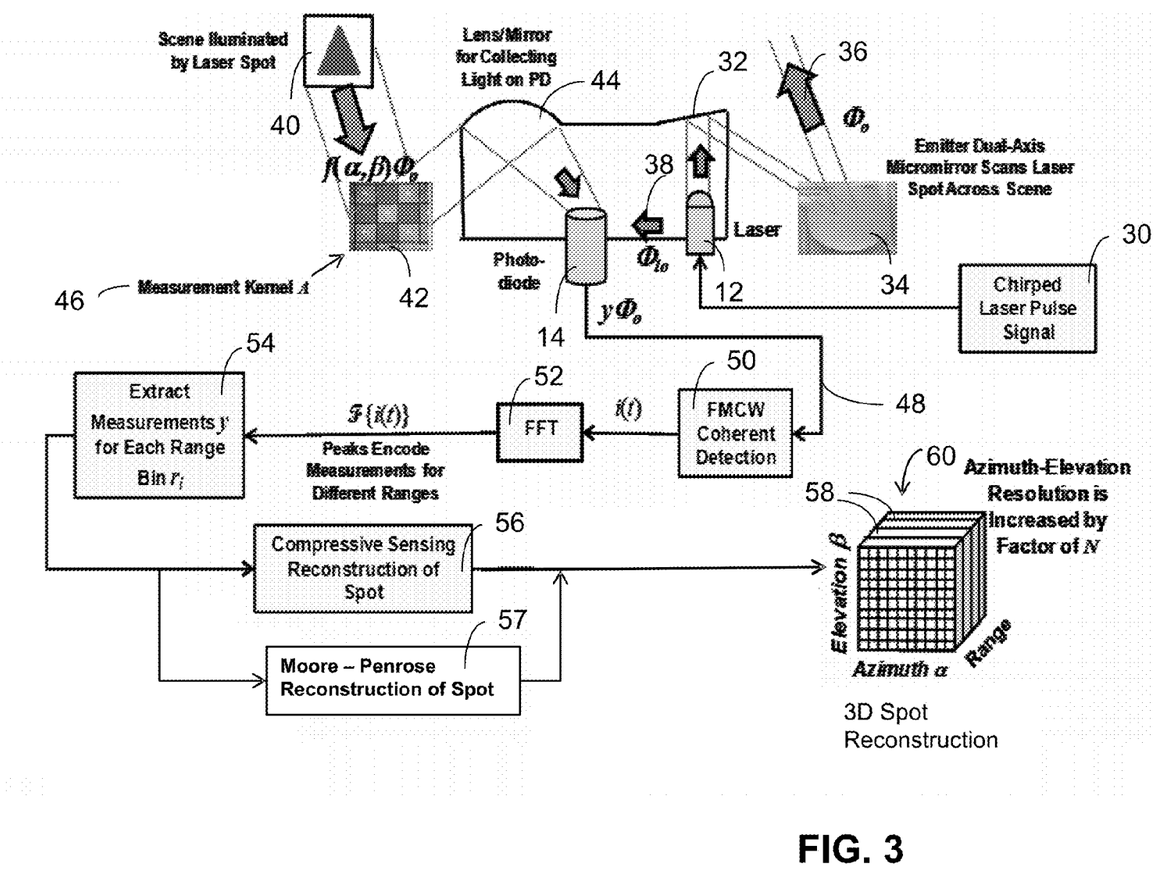
FIG. 3 shows a compressive sensing scanned lidar architecture in accordance with the present disclosure.

FIG. 3 shows a compressive sensing scanned LIDAR architecture in accordance with the present disclosure. A laser 12 is modulated by a linear chirp in frequency by chirped laser pulse signal 30. The emitted beam with power $\Phi_o$ may be reflected from mirror 32 to a dual-axis micromirror 34, which scans the emitted beam 36 across the scene. Part of the beam 38 with power $\Phi_{lo}$, is mixed for coherent detection with the returned light from the scene at the photodiode detector 14. The light from the laser 12, which may as shown in FIG. 2 have a beam width of 0.2 degrees, illuminates a small spot on the scene. The reflection 40 from the scene is directed by a receiver programmable N-pixel mirror array 42, or a programmable N-pixel mask 42, either one of which may be a microelectro-mechanical systems (MEMS), to a lens 44, which focuses the spot onto the photodiode 14. The receiver programmable mirror or mask array 42 is synchronized with the dual axis micromirror 34, which may also be a microelectromechanical system (MEMS), to maintain the reflection 40 from the scanned beam 36 focused on the photodiode 14.

Figure 4:
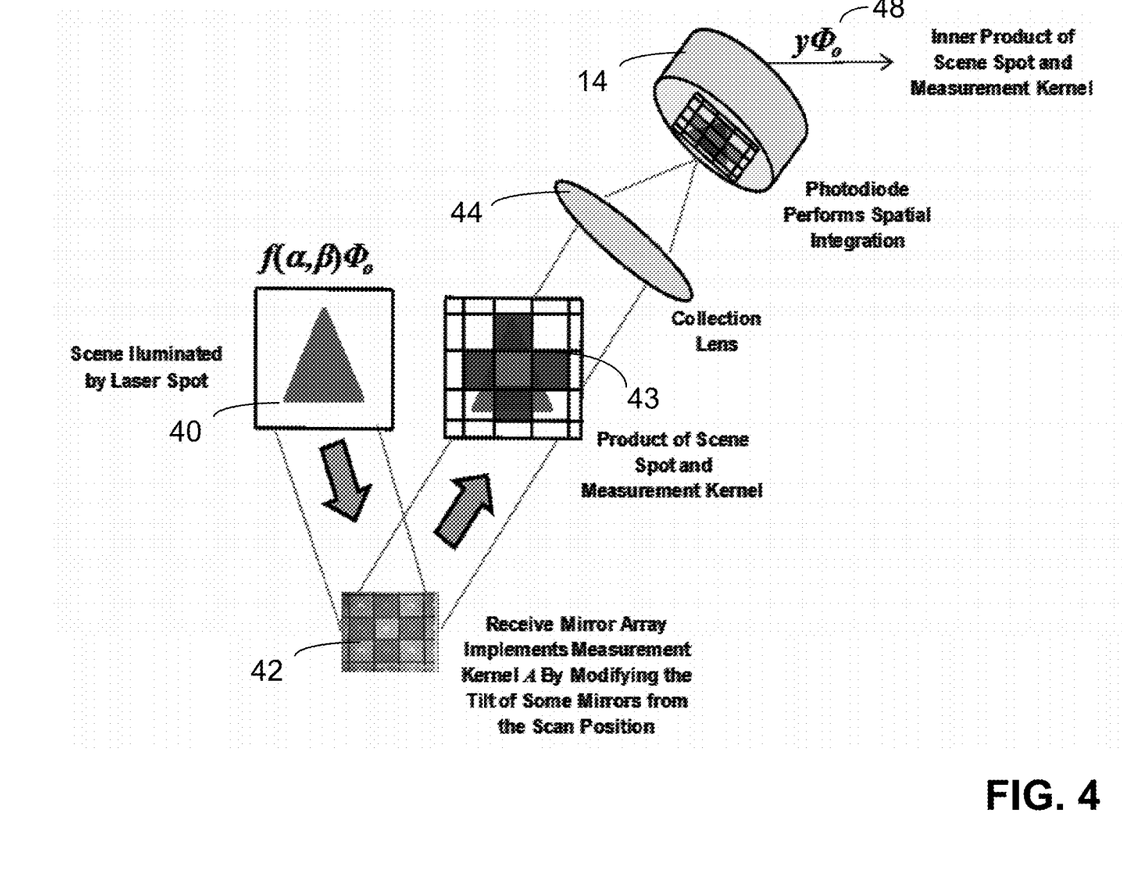
FIG. 4 shows a process for forming an inner product of a scene spot and a measurement kernel in accordance with the present disclosure.

The received reflected laser scene spot 40 may be represented by $f(\alpha,\beta)\Phi_o$ 40, as shown in FIGS. 3 and 4, where $f(\alpha,\beta)$ is the reflectivity of the scene illuminated by the emitted laser beam 36 with power $\Phi_o$, and $\alpha$ and $\beta$ are the azimuth and elevation angles, respectively.

The received reflected laser scene spot 40 is multiplied in the receiver programmable mirror or mask array 42 by a measurement kernel $A_j$ 46, to form a product 43, as shown in FIG. 4, of the received reflected laser scene spot and each measurement kernel $A_j$ 46. The measurement kernel may be binary, which means that each pixel in the N-pixel micromirror or mask 42 may be set to be on in order to pass light to the photodiode 14, or off in order to block light for that pixel from the photodiode 14. Here the "on" and "off" states correspond to different tilt angles of each micromirror. The binary measurement kernels $A_j$ 46 can be implemented by programming some of the N micromirrors in the receiver programmable mirror array 42 to tilt the light away from the receiver lens aperture 44, or by programming a N-pixel programmable mask so that some areas of the returned light are masked and some areas of the mask are transparent to the returned light.

Temporal modulation of individual mirrors or masks in the receiver programmable mirror or mask array 42 may be used to implement measurement kernels $A_j$ 46 with multi-valued elements. For example, a pixel may be set on for a time t1 and off for a time t2, and the result integrated by the photodiode to implement a measurement kernels $A_j$ 46 with a non-binary value.

The photodiode 14 performs spatial integration of $A_j f(\alpha,\beta)\Phi_o$, forming the inner-product measurement $y\Phi_o$ 48, as shown in FIGS. 3 and 4, where y is the inner product of the scene reflectivity $f(\alpha,\beta)$ with the measurement kernel $A_j$. $\Phi_o$ is the output laser power.

Figures 5A, 5B:
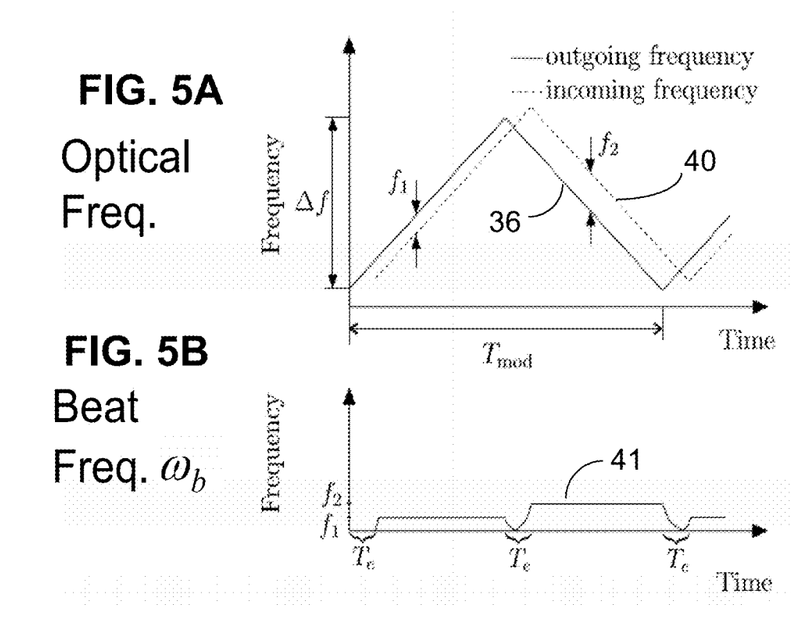
FIG. 5A shows the frequencies of the emitted laser beam and the received reflected scene spot.
FIG. 5B shows the corresponding beat frequency of emitted laser beam beat with the received reflected scene in accordance with the present disclosure.

The photodiode 14 output current is given by $$i(t)=S(\Phi_{lo}+y\Phi_o+2\sqrt{y\Phi_{lo}\Phi_o}\cos(\omega_b t+\phi))+i_b$$

where y is the inner product of the scene reflectivity $f(\alpha,\beta)$ with the measurement kernel $A_j$, $\Phi_o$ is the output laser power, $\Phi_{lo}$ is the local oscillator power, $\omega_b$ and $\phi$ are a beat frequency 41, as shown in FIG. 5B, and phase difference between the local oscillator frequency, which is the frequency of the emitted laser beam 36, and the return light which is the received reflected scene spot 40, respectively, S is the diode responsivity, $i_b$ is the diode bias current, and t is time.

By modulating the emitted pulsed beam 36 with frequency modulation continuous wave (FMCW) modulation, the range $R_a$, the range uncertainty $\Delta R_a$, and the velocity $v_t$ of the target spot components for the measurement kernel $A_j$ may be determined. FIG. 5A shows the frequencies of the emitted laser beam 36 and the received reflected scene spot 40, and FIG. 5B shows the corresponding beat frequency 41 of the emitted laser beam mixed with the received reflected scene. By using FMCW modulation, FMCW coherent detection 50 can use the equations below to determine parameters of the target spot components, including the range $R_a$, the range uncertainty $\Delta R_a$, and the velocity $v_t$, where $f_1$ is the frequency of the emitted beam 36, and $f_2$ is the frequency of the received reflected laser scene spot 40, as shown in FIG. 5A.

$$f_R = \frac{f_1 + f_2}{2} = \frac{4R_a \Delta f}{cT_{mod}}$$

where Tmod is the cycle time for emitting and processing each FMCW modulated laser pulse and $\Delta f$ is the maximum frequency shift of the emitted light, as shown in FIG. 5A.

$$f_D = \frac{f_2 - f_1}{2} = \frac{2v_t}{\lambda}$$

$$\Delta R_a = \frac{c}{2\Delta f}$$

Then by taking the Fourier transform using Fast Fourier Transform (FFT) 52 and extracting the power of the beat frequency component 41, as shown in FIG. 5B in block 54, shown in FIG. 3, y for measurement kernel $A_j$ can be measured for each range bin $r_i$, where y is the inner product of the scene reflectivity $f(\alpha,\beta)$ with the measurement kernel $A_j$.

This process is repeated for each measurement kernel $A_1$ to $A_M$, where M is the number of measurement kernels. The result is a measurement vector y, which can be expressed as $$y = Af + \xi$$

where f is the scene reflectivity image arranged into a vector, A is the measurement matrix consisting of rows of different measurement kernels $A_j$ 46, and $\xi$ is additive noise. Because real scenes are known to be not random, the reflectivity for the range associated with one of the beat frequency components f may be decomposed into a sparse representation using a dictionary D and corresponding coefficients $\theta$:

$$f = D\theta$$

f can be rearranged into a range slice $f(\beta,\beta)$ of the 3D scene where $\alpha$ and $\beta$ are the azimuth and elevation angles.

Then reconstruction of the spot illuminated and reflected from the target may be performed using compressive sensing reconstruction 56 or by a Moore-Penrose reconstruction of the spot 57, shown in FIG. 3.

If M measurements are made and M is less than N, where N is the number of mirrors or masks in the programmable receive micromirror or mask array 42, and if $\theta$ is sufficiently sparse in $f = D\theta$, then compressive sensing can be used to reconstruct f using the $L_1$ norm:

$$\hat{\theta} = \underset{\theta}{\operatorname{argmin}}(\|y - AD\theta\|_2^2 + \alpha\|\theta\|_1)$$

$$\hat{f} = D\hat{\theta}$$

A variety of software tools have been developed in the compressive sensing field to solve the above optimization problem efficiently. Examples of such tools are Lasso, L1-MAGIC, SparseLab, SPAMS, and YALL1.

If M is greater than or equal to N, then f can be reconstructed using the Moore-Penrose inverse of matrix A:

$$\hat{f} = A^+ y$$

where $$A^+ = (A^H A)^{-1} A^H$$

The Moore-Penrose inverse $A^+$ can be precomputed. The advantage of using the Moore-Penrose inverse is that sparsity is not required and the reconstruction consists of simple matrix-vector multiplication, which can be performed very quickly. The disadvantage is that more measurements are required than for compressive sensing.

The result of the reconstruction is a 3D reconstruction of the spot 60. Each range slice 58 represent the beat frequency components at a particular range in the photodiode signal i(t) as determined by FMCW coherent detection 50, and FFT 52. The resolution and quality of the reconstructed 3D spot depends on both N and M. Since the number of reconstructed pixels in a range slice image is equal to N, relatively small values of N and M will increase the resolution by a large factor over the non-compressive system, whose resolution is limited by by the laser spot size.

To complete the reconstruction of the entire scanned scene, the emitted beam 36 is scanned to successive spots in the scene and each successive spot reconstructed.

Figure 6:
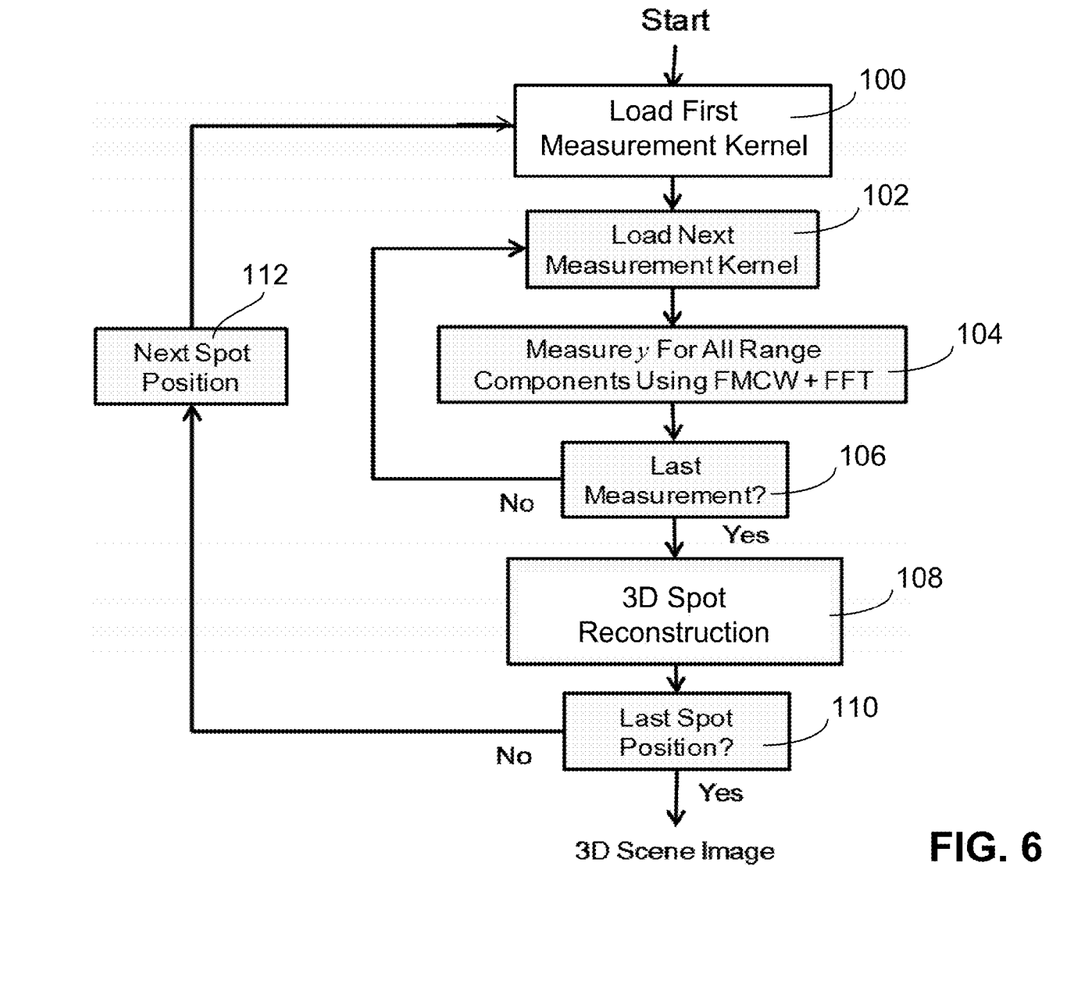
FIG. 6 shows a processing flow for reconstruction of a 3D scene frame in accordance with the present disclosure.

A flow diagram of processing for compressive sensing and reconstruction of a spot is shown in FIG. 6. In step 100, the first measurement kernel is loaded, then in step 102 the programmable N-pixel micromirror or mask 42 is programmed with the first measurement kernel $A_1$ 46 for the first measurement of a received reflected scene spot 40. Next in step 104 y, the inner product of the scene reflectivity $f(\alpha,\beta)$ with the measurement kernel $A_1$, is measured and extracted using FMCW coherent detection 50, FFT processing 52, and block 54 for each range bin $r_i$. Steps 102 and 104 are then repeated for the received reflected scene spot 40 for each measurement kernel $A_j$, until in step 106 it is determined that y has been measured and extracted using all of the measurement kernels $A_1$ to $A_M$.

Next in step 108 the 3D spot is reconstructed, as shown by 3D spot reconstruction 60 in FIG. 3. If M measurements are made and M is less than N, where N is the number of programmable mirrors or masks 42 in the programmable N-pixel receive micromirror or mask array 42, and if $\theta$ is sufficiently sparse, then step 108 is performed using compressive sensing to reconstruct f using the $L_1$ norm:

$$\hat{\theta} = \underset{\theta}{\operatorname{argmin}}(\|y - AD\theta\|_2^2 + \alpha\|\theta\|_1)$$

$$\hat{f} = D\hat{\theta}$$

If M is greater than or equal to N, then step 108 is performed using the Moore-Penrose inverse of matrix A:

$$\hat{f} = A^+ y$$

where $$A^+ = (A^H A)^{-1} A^H$$

Next in step 110, it is determined whether the reconstructed spot is the last spot position. If not, then steps 100, 102, 104, 106, and 108 are repeated for the next spot position. If the reconstructed spot is the last spot position, then the laser scanned 3D scene image has been reconstructed.

All computations and controls that are needed for the FMCW 50, the FFT 52, extracting y measurements 54, compressive sensing 56, Moore-Penrose reconstruction of the spot 57, and 3D spot reconstruction 60, control of the programmable micromirror or mask array 42, and execution of the process shown in FIG. 6, as well as any other computations or controls needed for the present disclosure may be provided by any processor, such as but not limited to a computer, a processor, a microprocessor, a microcomputer, or any element capable of performing computations and storing results of the computation.

Advantages of the compressive sensing scanned LIDAR system include much lower size, weight and power (SWAP) and lower cost than mechanically scanned LIDAR systems. The compressive sensing LIDAR also has higher angular resolution, field of view, and optical efficiency than flash LIDAR systems which need to illuminate the entire scene at once. The number of resolvable spots in azimuth and elevation is increased by a factor of N, where N is the number of mirrors or masks in the receiver MEMS micromirror array or mask array. Even arrays with small N will increase the resolution by a large factor while keeping the computational load low. Since the range slice images are reconstructed independently, multiple slices can be reconstructed in parallel using multi-core processing architectures. Also, both scene reflectance and 3D structure are measured simultaneously and automatically registered.

The azimuth and elevation angular resolution can be adapted for each part of the scene by varying the effective receiver micromirror or mask array resolution (N) and the number of measurements (M) in order to optimize the resolution of important regions of interest while maintaining the update rate. For example the programmable micromirror or mask array 42 may be programmed so that N is decreased to attain lower resolution. Regions of interest (ROIs) can be detected using algorithms operating on low resolution sampling of a wide field of view. The ROIs may then be resampled or scanned using a higher N for high resolution which maintains the update rate at the high value associated with low resolution sampling while having the benefit of high resolution on the ROIs for recognition purposes. The resolution can be increased for ROIs without changing the spot scanning pattern by varying N and M. Composite resolution measurement kernels can be used to implement variable resolution within a spot in order to further reduce the number of measurements needed.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for increasing resolution of an image formed of received light from an illuminated spot comprising:
    measuring a y vector for measurement kernels $A_1$ to $A_M$, where M is a number of the measurement kernels, measuring the y vector comprising:
        programming a programmable N-pixel micromirror or mask located in a return path of a received reflected scene spot with a jth measurement kernel $A_j$ of the measurement kernels $A_1$ to $A_M$;
        measuring y, wherein y is an inner product of a scene reflectivity $f(\alpha,\beta)$ with the measurement kernel $A_j$ for each range bin $r_i$, wherein $\alpha$ and $\beta$ are azimuth and elevation angles, respectively;
        repeating programming the programmable N-pixel micromirror or mask and measuring y for each measurement kernel $A_1$ to $A_M$; and
    forming a reconstructed image using the measured y vector, wherein forming the reconstructed image comprises using compressive sensing or Moore-Penrose reconstruction.

2. The method of claim 1 wherein measuring y comprises:
    illuminating the spot using a light source with frequency modulation continuous wave (FMCW) modulation;
    using FMCW coherent detection; and
    using Fourier analysis.

3. The method of claim 1 wherein forming a reconstructed image comprises:
    using compressive sensing if M is less than N, and if $\theta$ is sufficiently sparse to reconstruct f using an $L_1$ norm:

$$\hat{\theta} = \operatorname*{argmin}_{\theta}(\|y - AD\theta\|_2^2 + \alpha\|\theta\|_1)$$

$$\hat{f} = D\hat{\theta};$$

wherein D comprises a dictionary D and $\theta$ comprise corresponding coefficients.

4. The method of claim 1 wherein forming a reconstructed image comprises:

if M is greater than or equal to N, using a Moore-Penrose inverse of matrix A to reconstruct f $$\hat{f}=A^+y$$

where $$A^+=(A^HA)^{-1}A^H.$$

5. The method of claim 1 wherein the illuminated spot is illuminated by a scanning laser and wherein the method further comprises:
scanning the laser; and
repeating forming the reconstructed image for each spot illuminated by the laser;
wherein measuring y further comprises:
  emitting a laser beam having triangular frequency modulation continuous wave (FMCW) from the scanning laser;
  mixing a portion of the emitted laser beam with the received light at a photodiode detector for coherent detection;
  wherein the scanning laser comprises a scanning micromirror; and
  wherein the programmable N-pixel micromirror is synchronized with the scanning micromirror to maintain the received light focused on a photodiode detector.

6. The method of claim 1 further comprising:
illuminating the illuminated spot using a laser; and
detecting the received light using a photodiode detector;
wherein a photodiode output current is $$i(t)=S(\Phi_{lo}+y\Phi_o+2\sqrt{y\Phi_{lo}\Phi_o}\cos(\omega_b t+\phi))+i_b$$

where y is an inner product of the scene reflectivity $f(\alpha,\beta)$ with a measurement kernel $A_j$, $\Phi_o$ is an output laser power, $\Phi_{lo}$ is an local oscillator power, $\omega_b$ is a beat between the laser and the received light, $\phi$ is a phase difference between the laser and the return light, S is a diode responsivity, $i_b$ is a diode bias current, and t is time.

7. The method of claim 2 further comprising:
determining parameters for target components of the illuminated spot, including a range $R_a$, a range uncertainty $\Delta R_a$, and a velocity $v_t$ for each target component using equations $$f_R=\frac{f_1+f_2}{2}=\frac{4R_a\Delta f}{cT_{mod}}$$

$$f_D=\frac{f_2-f_1}{2}=\frac{2v_t}{\lambda}$$

$$\Delta R_a=\frac{c}{2\Delta f};$$

where $f_1$ is a frequency of a source illuminating the spot, and $f_2$ is a frequency of the received light.

8. The method of claim 1 wherein:
each measurement kernel $A_j$ is binary.

9. The method of claim 1 wherein:
each pixel in the N-pixel micromirror or mask may be set to be on in order to pass the received light to a photodiode detector, or off in order to block the received light from the photodiode detector; and
further comprising:
modulating a pixel in the N-pixel micromirror or mask to be on or off over time; and
integrating passed or blocked received light for a pixel in the N-pixel micromirror or mask in a photodetector diode to provide multi-valued measurement kernels.

10. The method of claim 1 further comprising:
adapting an azimuth and elevation angular resolution for an illuminated spot in order to optimize resolution of regions of interest and update rates comprising:
  varying an effective programmable N-pixel micromirror or mask resolution by programming the programmable N-pixel micromirror or mask to effectively reduce N; and
varying a number of measurements (M).

11. A LIDAR system comprising:
a pulsed frequency modulated laser having an emitted beam with power $\Phi_o$;
a micromirror optically coupled to the laser for scanning the emitted beam across a scene to illuminate spots in the scene;
a photodiode detector;
a portion of the emitted beam with power $\Phi_{lo}$ coupled to the photodiode detector; and
a programmable N-pixel micromirror or mask in an optical path of reflected received light from an illuminated spot, the programmable N-pixel micromirror or mask optically coupled to the photodiode detector;
means for measuring a y vector for measurement kernels $A_1$ to $A_M$, where M is a number of the measurement kernels, the means for measuring the y vector comprising:
  means for programming the programmable N-pixel micromirror or mask with a jth measurement kernel $A_j$ of the measurement kernels $A_1$ to $A_M$;
  means for measuring y, wherein y is an inner product of a scene reflectivity $f(\alpha,\beta)$ with the measurement kernel $A_j$ for each range bin $r_i$, wherein $\alpha$ and $\beta$ are azimuth and elevation angles, respectively;
  means for repeating programming the programmable N-pixel micromirror or mask and measuring y for each measurement kernel $A_1$ to $A_M$; and
means for forming a reconstructed image using the measured y vector comprising compressive sensing or Moore-Penrose reconstruction.

12. The system of claim 11:
wherein the compressive sensing means is used if M is less than N, and if $\theta$ sufficiently sparse to reconstruct f using an $L_1$ norm:

$$\hat{\theta}=\underset{\theta}{\operatorname{argmin}}(\|y-AD\theta\|_2^2+\alpha\|\theta\|_1)$$

$$\hat{f}=D\hat{\theta};$$

wherein D comprises a dictionary D and $\theta$ comprise corresponding coefficients; and
wherein the Moore Penrose reconstruction is used to reconstruct f if M is greater than or equal to N, using a Moore-Penrose inverse of matrix A $$\hat{f}=A^+y$$

where $$A^+=(A^HA)^{-1}A^H.$$

13. The system of claim 11 wherein:
wherein a photodiode output current of the photodiode detector is $$i(t)=S(\Phi_{lo}+y\Phi_o+2\sqrt{y\Phi_{lo}\Phi_o}\cos(\omega_b t+\phi))+i_b$$

where y is an inner product of the scene reflectivity f(α,β) with a measurement kernel $A_j$, $\Phi_o$ is an output laser power, $\Phi_{lo}$ is an local oscillator power, $\omega_b$ is a beat between the laser and the received light, φ is a phase difference between the laser and the return light, S is a diode responsivity, $i_b$ is a diode bias current, and t is time.

14. The system of claim 11 further comprising:
means for determining parameters for target components of the illuminated spot, including a range $R_a$, a range uncertainty $\Delta R_a$, and a velocity $v_t$ for each target component using equations $$f_R = \frac{f_1 + f_2}{2} = \frac{4R_a \Delta f}{cT_{mod}}$$

$$f_D = \frac{f_2 - f_1}{2} = \frac{2v_t}{\lambda}$$

$$\Delta R_a = \frac{c}{2\Delta f};$$

where $f_1$ is a frequency of the laser, and $f_2$ is a frequency of the received light.

15. The system of claim 11 wherein each measurement kernel $A_j$ is binary.

16. The system of claim 11 further comprising:
means for setting each pixel in the N-pixel micromirror or mask to be on in order to pass the received light to the photodiode detector, or off in order to block the received light from the photodiode detector; and
means for modulating a pixel in the N-pixel micromirror or mask to be on or off over time to provide multi-valued measurement kernels.

17. A LIDAR comprising:
a scanning laser for scanning a scene and illuminating a spot in the scene;
a photodiode detector for detecting received light reflected from the scene;
a programmable N-pixel micromirror or mask in an optical path of reflected received light, the programmable N-pixel micromirror or mask optically coupled to the photodiode detector; and
means for forming a reconstructed image comprising compressive sensing or Moore-Penrose reconstruction;
means for measuring a y vector for measurement kernels $A_1$ to $A_M$, where M is a number of the measurement kernels, the means for measuring the y vector comprising:
 means for programming the programmable N-pixel micromirror or mask with a jth measurement kernel $A_j$ of the measurement kernels $A_1$ to $A_M$;
 means for measuring y, wherein y is an inner product of a scene reflectivity f(α,β) with the measurement kernel $A_j$ for each range bin $r_i$, wherein α and β are azimuth and elevation angles, respectively;
 means for repeating programming the programmable N-pixel micromirror or mask and measuring y for each measurement kernel $A_1$ to $A_M$; and means for forming a reconstructed image using the measured y vector comprising compressive sensing or Moore-Penrose reconstruction.

18. The LIDAR of claim 17 wherein the means for forming a reconstructed image comprises:
a compressive sensing means and wherein the compressive sensing means is used if M is less than N, and if θ is sufficiently sparse to reconstruct f using an $L_1$ norm:

$$\hat{\theta} = \underset{\theta}{\operatorname{argmin}}(\|y - AD\theta\|_2^2 + \alpha\|\theta\|_1)$$

$$\hat{f} = D\hat{\theta};$$

wherein D comprises a dictionary D and θ comprise corresponding coefficients.

19. The LIDAR of claim 17 wherein the means for forming a reconstructed image comprises:
a Moore-Penrose reconstruction, wherein the Moore-Penrose reconstruction is used to reconstruct f if M is greater than or equal to N, using a Moore-Penrose inverse of matrix A $$\hat{f} = A^+ y$$

where $$A^+ = (A^H A)^{-1} A^H.$$

20. The LIDAR of claim 17:
wherein a photodiode output current of the photodiode detector is $$i(t) = S(\Phi_{lo} + y\Phi_o + 2\sqrt{y\Phi_{lo}\Phi_o}\cos(\omega_b t + \phi)) + i_b$$

where y is an inner product of the scene reflectivity f(α,β) with a measurement kernel $A_j$, $\Phi_o$ is an output laser power, $\Phi_{lo}$ is an local oscillator power, $\omega_b$ is a beat between the laser and the received light, φ is a phase difference between the laser and the return light, S is a diode responsivity, $i_b$ is a diode bias current, and t is time; and
further comprising:
means for determining parameters for target components in the illuminated spot, including a range $R_a$, a range uncertainty $\Delta R_a$, and a velocity $v_t$ for each target component using equations $$f_R = \frac{f_1 + f_2}{2} = \frac{4R_a \Delta f}{cT_{mod}}$$

$$f_D = \frac{f_2 - f_1}{2} = \frac{2v_t}{\lambda}$$

$$\Delta R_a = \frac{c}{2\Delta f};$$

where $f_1$ is a frequency of the laser, and $f_2$ is a frequency of the received light.

* * * * *